(12) United States Patent
Du et al.

(10) Patent No.: US 12,328,997 B2
(45) Date of Patent: Jun. 10, 2025

(54) DISPLAY PANEL AND DISPLAY APPARATUS HAVING ARRANGEMENT OF DAM REGIONS

(71) Applicants: Chengdu BOE Optoelectronics Technology Co., Ltd., Chengdu (CN); BOE Technology Group Co., Ltd., Beijing (CN)

(72) Inventors: Sen Du, Beijing (CN); Li Song, Beijing (CN); Pengfei Yu, Beijing (CN); Jie Dai, Beijing (CN); Lu Bai, Beijing (CN)

(73) Assignees: Chengdu BOE Optoelectronics Technology Co., Ltd., Chengdu (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 17/292,754

(22) PCT Filed: Jul. 27, 2020

(86) PCT No.: PCT/CN2020/104943
§ 371 (c)(1),
(2) Date: May 11, 2021

(87) PCT Pub. No.: WO2022/021020
PCT Pub. Date: Feb. 3, 2022

(65) Prior Publication Data
US 2023/0157079 A1 May 18, 2023

(51) Int. Cl.
*H10K 59/131* (2023.01)
*H10K 59/122* (2023.01)
*H10K 59/80* (2023.01)

(52) U.S. Cl.
CPC ......... *H10K 59/131* (2023.02); *H10K 59/122* (2023.02); *H10K 59/873* (2023.02)

(58) Field of Classification Search
CPC ... H10K 59/122; H10K 59/131; H10K 59/873
See application file for complete search history.

(56) References Cited

U.S. PATENT DOCUMENTS

2012/0074423 A1  3/2012  Kanegae
2017/0345881 A1* 11/2017 Kim ..................... H10K 59/123
(Continued)

FOREIGN PATENT DOCUMENTS

CN  107437554 A  12/2017
CN  109616583 A   4/2019
(Continued)

OTHER PUBLICATIONS

Office Action received for Chinese Patent Application No. 202080001365.X, mailed on Jan. 27, 2025, 29 pages (18 pages of English Translation and 11 pages of Original Document).

*Primary Examiner* — Herve-Louis Y Assouman
*Assistant Examiner* — Christopher M Roland
(74) *Attorney, Agent, or Firm* — ArentFox Schiff LLP; Michael Fainberg

(57) ABSTRACT

This disclosure discloses a display panel and a display apparatus. The display panel includes: a substrate, wherein the substrate has a display region and a border region surrounding the display region; the border region includes a first power voltage line and a first planarization layer sequentially stacked on a side of the substrate; the border region has a first dam region surrounding the display region and a second dam region surrounding the first dam region; an orthographic projection of the first power voltage line on the substrate is within the first dam region; the first planarization layer is at least within the first dam region and the second dam region, and the first planarization layer within (Continued)

the first dam region at least covers a side surface of the first power voltage line; and the first planarization layer has a first groove and a second groove.

11 Claims, 7 Drawing Sheets

(56) References Cited

U.S. PATENT DOCUMENTS

| | | | |
|---|---|---|---|
| 2018/0097034 A1* | 4/2018 | Lee | H10K 59/131 |
| 2019/0214446 A1* | 7/2019 | Kim | H10K 50/8445 |
| 2019/0305072 A1* | 10/2019 | Park | H10K 50/86 |
| 2020/0083306 A1* | 3/2020 | Choi | H10K 50/8426 |
| 2020/0373518 A1* | 11/2020 | Lee | H10K 50/822 |
| 2020/0411596 A1 | 12/2020 | Guo et al. | |
| 2021/0074788 A1 | 3/2021 | Cheng et al. | |
| 2022/0115625 A1* | 4/2022 | Yu | H10K 50/844 |

FOREIGN PATENT DOCUMENTS

| | | |
|---|---|---|
| CN | 109713017 A | 5/2019 |
| CN | 110032007 A | 7/2019 |
| CN | 110265459 A | 9/2019 |
| CN | 110265576 A | 9/2019 |
| KR | 10-2017-0090382 A | 8/2017 |

* cited by examiner

-- prior art --

DISPLAY PANEL AND DISPLAY APPARATUS HAVING ARRANGEMENT OF DAM REGIONS

CROSS REFERENCE TO RELATED APPLICATIONS

This application is a national phase entry under 35 U.S.C. § 371 of International Application No. PCT/CN2020/104943, filed on Jul. 27, 2020, the entire content of which is incorporated herein by reference.

FIELD

This disclosure relates to the technical field of display, in particular to a display panel and a display apparatus.

BACKGROUND

At present, a flexible display panel with an organic light-emitting diode (OLED) as a light-emitting device and signals controlled by thin film transistors has become the mainstream direction of the current OLED industry.

In the display panel, after a display substrate is formed, a chemical vapor deposition process is used for packaging to protect the light-emitting device, and to ensure that the light-emitting device and other structures inside the display panel do not undergo oxidation reaction with the outside. Once the package fails, for example, a packaging film is broken to form a gap, water and oxygen will enter the inside of the display panel along the gap, and the gap of the organic layer or inorganic layer will become a water and oxygen path. After the water and oxygen invade the organic light-emitting material of the OLED, the organic light-emitting material is oxidized and fails to emit light. As the water and oxygen continue to invade, the failure region gradually expands, the display panel shows poor displaying effects, and the service life of the display panel is affected.

SUMMARY

Embodiments of this disclosure provide a display panel and a display apparatus. The specific solutions are as follows.

Embodiments of this disclosure provide a display panel, including: a substrate, the substrate has a display region and a border region surrounding the display region; the border region includes a first power voltage line and a first planarization layer sequentially stacked on a side of the substrate.

The border region has a first dam region surrounding the display region and a second dam region surrounding the first dam region.

An orthographic projection of the first power voltage line on the substrate is within the first dam region.

At least a part of an orthographic projection of the first planarization layer on the substrate is within the first dam region and the second dam region, and a part of the first planarization layer within the first dam region at least covers a side surface of the first power voltage line.

The first planarization layer has a first groove and a second groove, the first groove is between the first dam region and the display region, and the second groove is between the first dam region and the second dam region.

Optionally, in the display panel provided by the embodiments of this disclosure, a side surface, away from the display region, of the first groove is opposite to a side surface, close to the display region, of the first power voltage line and end surfaces of the first power voltage line in an extension direction of the first power voltage line.

Optionally, in the display panel provided by the embodiments of this disclosure, the first power voltage line has a stepped structure, and a stepped surface of the stepped structure is on a side, close to the display region, of the first power voltage line; and a contour of the first groove is same as a contour of a side, adjacent to the first groove, of the first power voltage line.

Optionally, in the display panel provided by the embodiments of this disclosure, a ratio of a total width of the stepped structure in a first direction to a total height of the stepped structure in a second direction is greater than or equal to 5 and less than or equal to 10.

The first direction is the extension direction of the first power voltage line, and the second direction is perpendicular to the first direction.

Optionally, in the display panel provided by the embodiments of this disclosure, an angle between a side, close to the cut-off end in the extension direction of the first power voltage line and facing the display region, of the first power voltage line and an adjacent border of the display region is greater than 0 degree and less than or equal to 30 degrees; and a contour of the first groove is same as a contour of a side, adjacent to the first groove, of the first power voltage line.

Optionally, in the display panel provided by the embodiments of this disclosure, the first planarization layer has a third groove; and an orthographic projection of the third groove on the substrate is covered by the orthographic projection of the first power voltage line on the substrate.

Optionally, in the display panel provided by the embodiments of this disclosure, a pattern of the third groove is similar to a pattern of the first power voltage line.

Optionally, in the display panel provided by the embodiments of this disclosure, the border region further includes:
 a second power voltage line electrically connected to the first power voltage line and located between the substrate and the first power voltage line; and
 a second planarization layer located between a film layer where the second power voltage line is located and a film layer where the first power voltage line is located.

An orthographic projection of the second planarization layer on the substrate is within the first dam region and the second dam region.

Optionally, in the display panel provided by the embodiments of this disclosure, the border region further includes:
 an anode lapping layer on a side, facing away from the substrate, of the first planarization layer; and
 a pixel defining layer on a side, facing away from the substrate, of the anode lapping layer.

An orthographic projection of the anode lapping layer on the substrate at least partially overlaps with the orthographic projection of the first power voltage line on the substrate; and
 the anode lapping layer is electrically connected to the first power voltage line through the third groove.

Optionally, in the display panel provided by the embodiments of this disclosure, an orthographic projection of the pixel defining layer on the substrate at least covers a side surface of the anode lapping layer.

Correspondingly, Embodiments of this disclosure further provide a display apparatus, including any one of the above-mentioned display panels provided by the embodiments of this disclosure.

DETAILED DESCRIPTION OF THE EMBODIMENTS

Figure 1:
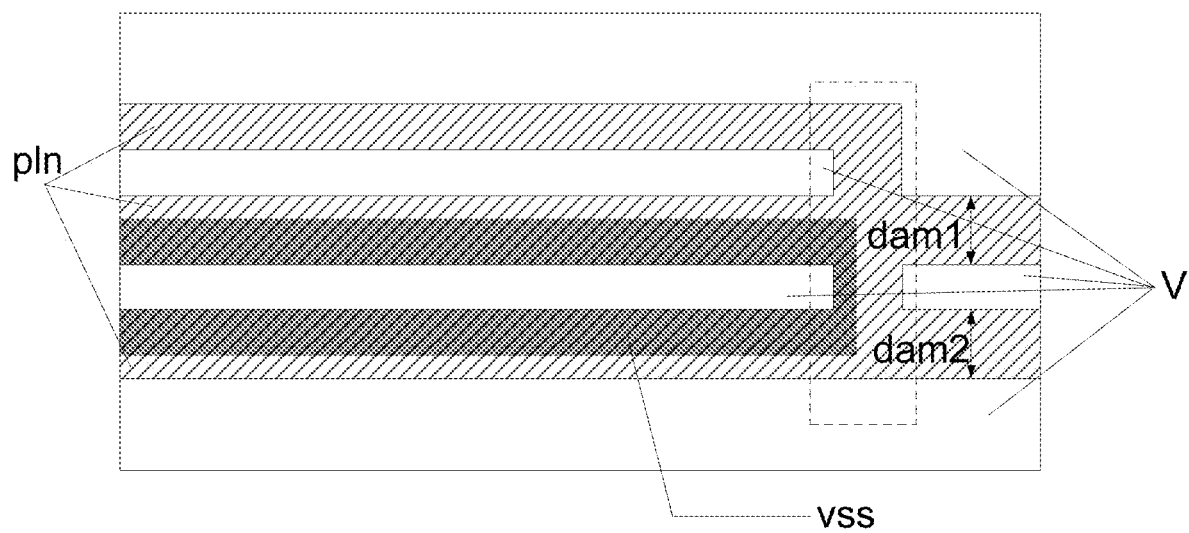
FIG. 1 is a schematic diagram of a partial structure of a display panel in the related art.

During specific implementation, water and oxygen channels can be circumvented by a design or process, but in a border region of a display panel, as shown in FIG. 1, a power voltage line vss electrically connected to a cathode layer (not shown in FIG. 1) is provided, and the power voltage line vss is generally of a Ti—Al—Ti structure. The Al is easily corroded by an anode etching solution in the subsequent process to form side pits. On the other hand, the anode etching solution is likely to react with Ag in an anode, causing the existence of Ag ions in the anode etching solution, so that the Al in the power voltage line reacts with the anode etching solution to replace elemental Ag. If the Ag diffuses into a display region, local dark spots are produced to cause poor display. Accordingly, in order to avoid the risk of further etching of the power voltage line vss by the subsequent process, the edge of the power voltage line vss needs to be covered with a planarization layer pin. However, at a cut-off end (in the dashed box in FIG. 1) of the power voltage line vss, the planarization layer pin communicates with a planarization layer pin in a first dam region dam1 and a second dam region dam2 to form an inevitable water and oxygen path. V in FIG. 1 represents grooves in the planarization layer pin.

In view of this, the embodiments of this disclosure provide a display panel and a display apparatus to reduce the risk of water and oxygen intrusion into the display panel.

In order to make the above objectives, features, and advantages of this disclosure more obvious and understandable, this disclosure will be further described below with reference to the accompanying drawings and embodiments. However, the example embodiments can be implemented in various forms, and should not be construed as being limited to the embodiments set forth herein. On the contrary, these embodiments are provided to make this disclosure more comprehensive and complete, and to fully convey the concept of the example embodiments to those skilled in the art. The same reference signs in the drawings indicate the same or similar structures, and thus their repeated description will be omitted. The terms expressing positions and directions described in this disclosure are all exemplified by drawings, but changes may also be made as required, and all the changes fall into the protection scope of this disclosure. The drawings of this disclosure are merely used to illustrate relative position relationships and do not represent true scales.

It should be noted that specific details are set forth in the following description in order to fully understand this disclosure. However, this disclosure can be implemented in a variety of other ways different from those described herein, and those skilled in the art can make similar promotion without departing from the connotation of this disclosure. Therefore, this disclosure is not limited by the specific embodiments disclosed below. The following descriptions of the specification are preferred embodiments for implementing this disclosure. However, the descriptions are for the purpose of explaining the general principles of this disclosure, and are not intended to limit the scope of this disclosure. The protection scope of this disclosure shall be subject to those defined in the appended claims.

The display panel and the display apparatus provided by the embodiments of this disclosure will be described in detail below with reference to the accompanying drawings.

Figure 4:
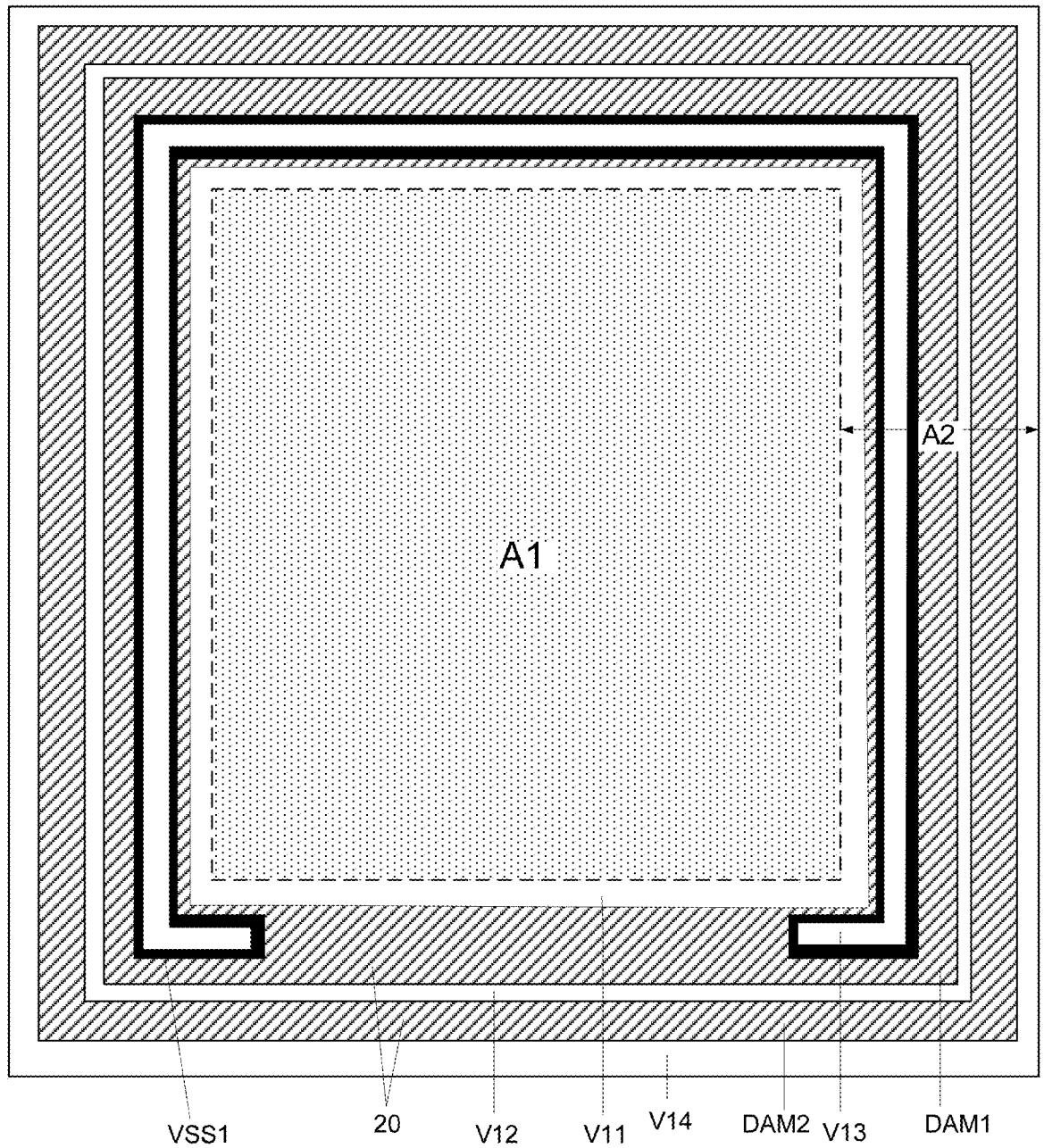
FIG. 4 is a first structural top view of a display panel provided by an embodiment of the present disclosure.

As shown in FIG. 4, a display panel provided by embodiments of this disclosure include a substrate, and the substrate has a display region A1 and a border region A2 surrounding the display region A1.

Figure 2:
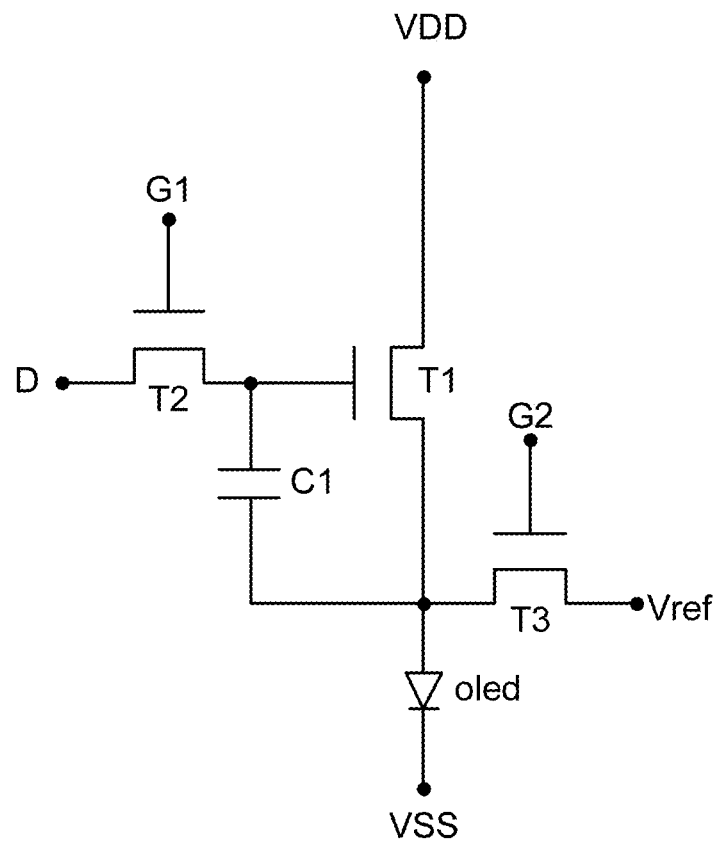
FIG. 2 is a schematic structural diagram of a pixel circuit provided by an embodiment of the present disclosure.

During specific implementation, the display region includes a light-emitting pixel array, and the light-emitting pixel array mainly includes a pixel circuit on the substrate and an organic light-emitting diode connected to the pixel circuit. The pixel circuit is mainly composed of a plurality of transistors and capacitors, such as the pixel circuit shown in FIG. 2.

Figure 3:
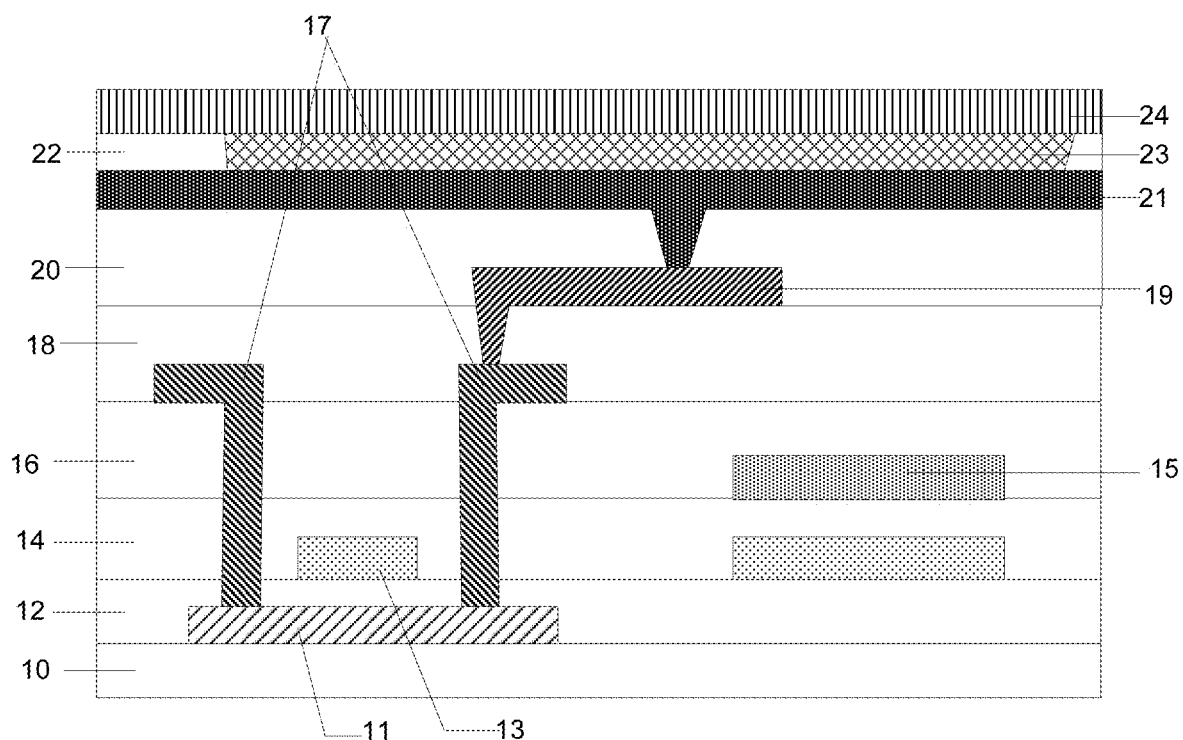
FIG. 3 is a cross-sectional structure diagram of a display region in a display panel provided by an embodiment of the present disclosure.

In some embodiments, as shown in FIG. 3, the display region includes an active layer 11, a first gate insulating layer 12, a gate layer 13, a second gate insulating layer 14, a storage electrode layer 15, a dielectric layer 16, a source and drain electrode layer 17, a second planarization layer 18, a power wiring layer 19, a first planarization layer 20, an anode layer 21, a pixel defining layer 22, a light-emitting layer 23, and a cathode layer 24 that are sequentially located on the substrate 10. In FIG. 4, taking bottom-gate transistors as an example, this disclosure does not limit the specific structure of the transistors, and the transistors may be of a bottom-gate structure, a top-gate structure, or other structures.

In the display panel provided by the embodiments of this disclosure, as shown in FIG. 4, the border region A2 includes a first power voltage line VSS1 and a first planarization layer 20 sequentially stacked on a side of the substrate (not shown in FIG. 4); and the border region A2 has a first dam region DAM1 surrounding the display region A1 and a second dam region DAM2 surrounding the first dam region DAM1.

Figure 5:
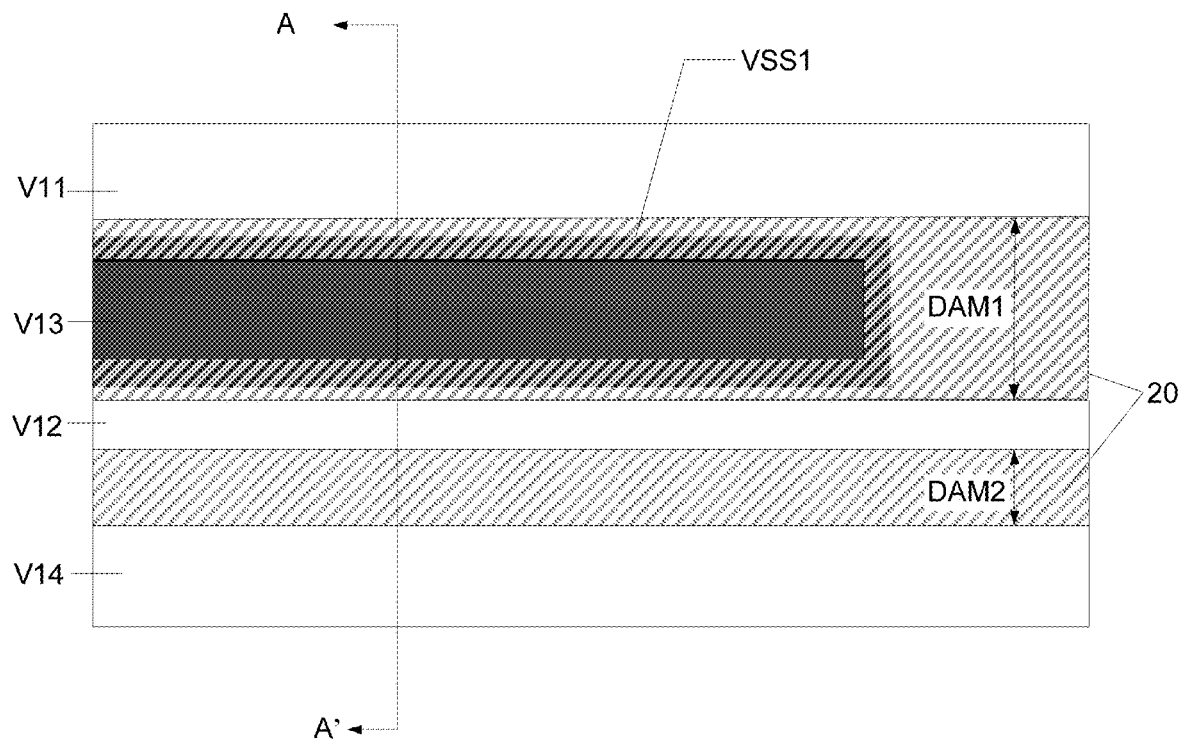
FIG. 5 is a partial structural top view of the display panel shown in FIG. 4.
Figure 6:
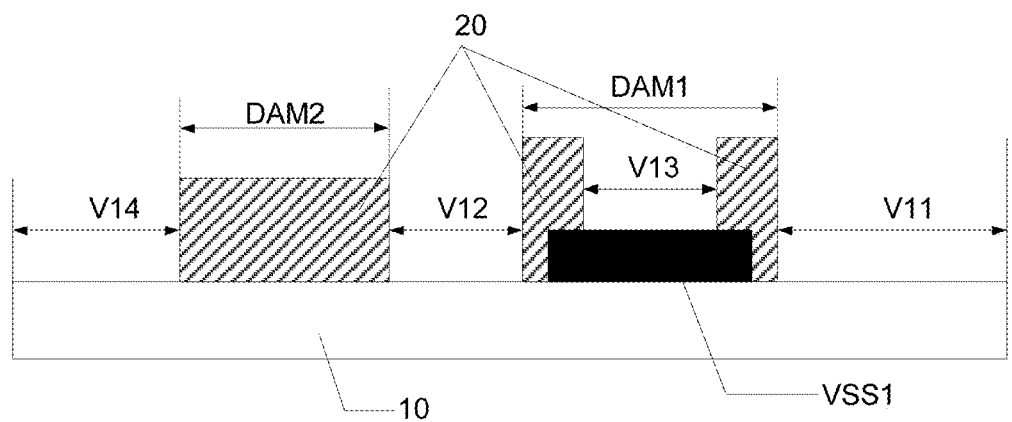
FIG. 6 is a cross-sectional structure diagram of the display panel shown in FIG. 5 along the AA' direction.

During specific implementation, the first dam region and the second dam region are used for protecting the display panel. The first power voltage line is electrically connected to the cathode layer. The smaller the resistance of the first power voltage line, the better the effect. Therefore, the first power voltage line is made into a ring structure surrounding the display region, so that the resistance of the first power voltage line is as small as possible. However, in practical applications, considering the overall design of the panel, the first power voltage line needs to be provided with an opening. For example, the first power voltage line is provided with an opening at a side, provided with a chip, of the display panel, so that the first power voltage line has two cut-off ends. In order to avoid the risk of further etching of the first power voltage line by the subsequent process, the edge of the first power voltage line needs to be covered with the first planarization layer. In order to avoid the formation of a water and oxygen path due to the communication between the first planarization layer at the cut-off end(s) of the first power voltage line and an organic layer in the dam region(s), an display panel is provided by embodiments of this disclosure, as shown in FIGS. 4 to 6.

An orthographic projection of the first power voltage line VSS1 on the substrate 10 is within the first dam region DAM1.

At least a part of an orthographic projection of the first planarization layer 20 on the substrate 10 is within the first dam region DAM1 and the second dam region DAM2, and the part of the first planarization layer 20, with an orthographic projection on the substrate 10 within the first dam region DAM1, at least covers a side surface of the first power voltage line VSS1.

The first planarization layer 20 has a first groove V11 and a second groove V12, the first groove V11 is between the first dam region DAM1 and the display region A1, and the second groove V12 is between the first dam region DAM1 and the second dam region DAM2.

In the above-mentioned display panel provided by the embodiments of this disclosure, the first planarization layer has the first groove and the second groove, and the first groove is between the first dam region and the display region, so that a water and oxygen barrier is formed between the first dam region and the display region; and the second groove is between the first dam region and the second dam region to avoid the formation of a water and oxygen path between the first dam region and the second dam region. The orthographic projection of the first power voltage line on the substrate is within the first dam region, so that the first planarization layer within the first dam region can be used to cover the side surface of the first power voltage line to avoid the risk of further etching of the first power voltage line by the subsequent process. On the other hand, the first power voltage line is arranged in the first dam region, and the first planarization layer has the second groove between the first dam region and the second dam region, which can avoid the communication between the first planarization layer at a cut-off end of the first power voltage line and the first planarization layer in the second dam region, thereby improving the water and oxygen blocking capability of the display panel.

Figure 7:
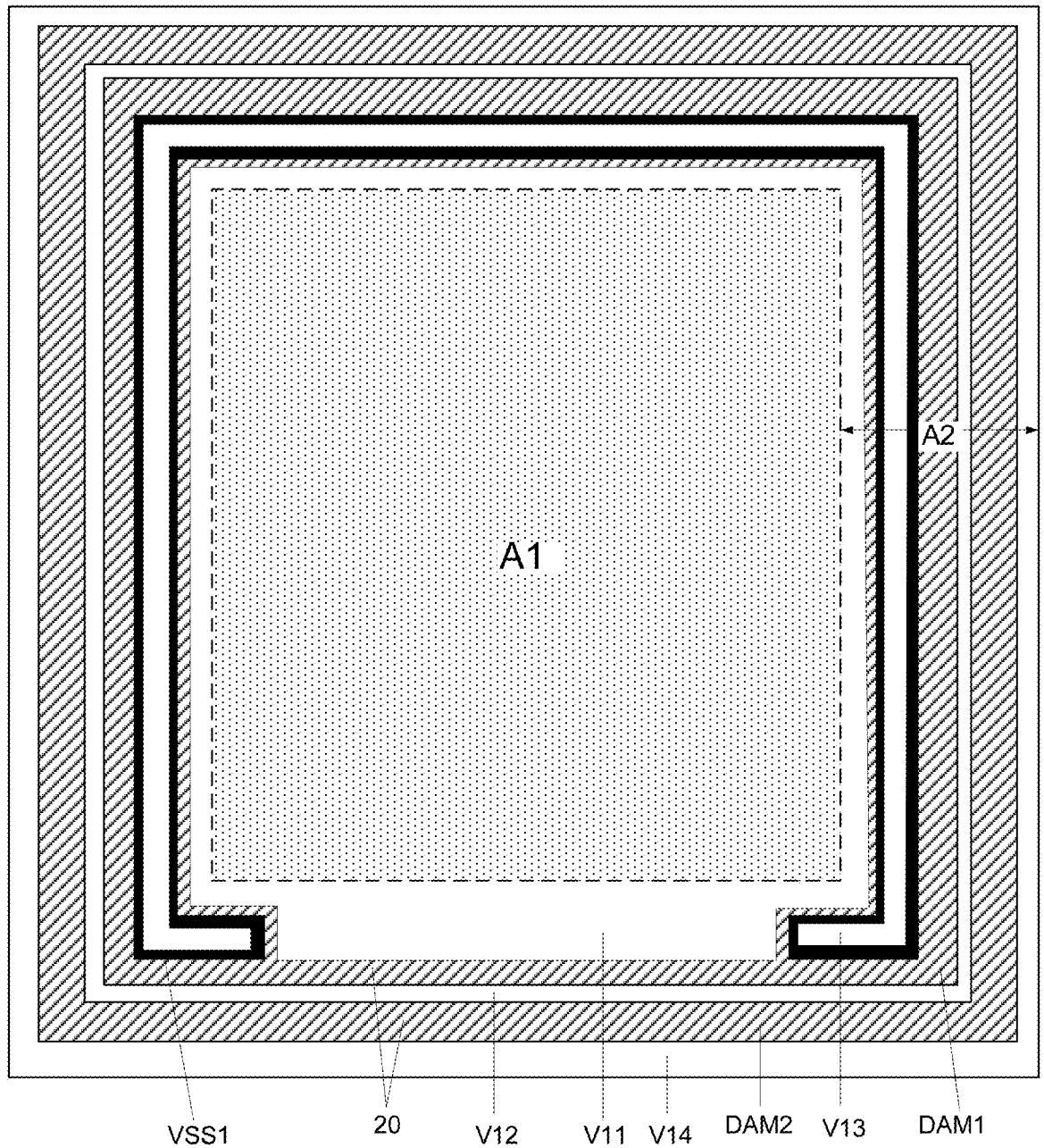
FIG. 7 is a second structural top view of a display panel provided by an embodiment of the present disclosure.
Figure 8:
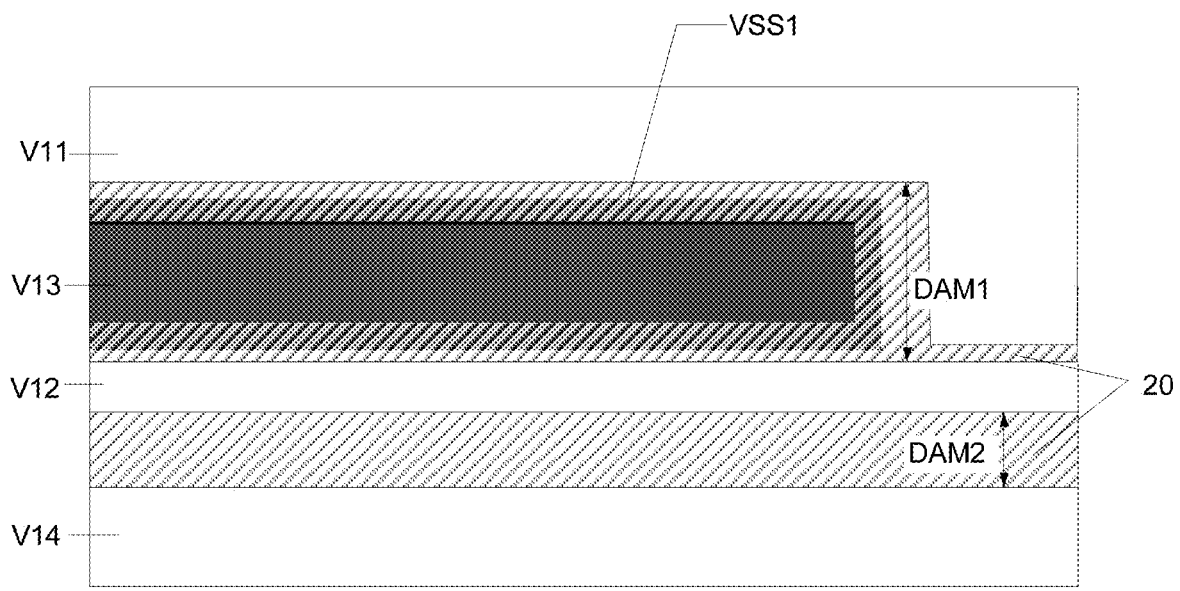
FIG. 8 is a partial structural top view of the display panel shown in FIG. 7.

Optionally, in the display panel provided by the embodiments of this disclosure, as shown in FIGS. 7 and 8, a side surface, away from the display region A1, of the first groove V11 is opposite to a side surface, close to the display region A1, of the first power voltage line VSS1 and end surfaces of the first power voltage line VSS1 in an extension direction of the first power voltage line. That is, a part of the first groove V11 is between the two end surfaces of the first power voltage line VSS1, and extends from one end surface of the first power voltage line VSS1 to the other end surface, thereby increasing the length of a water and oxygen blocking path between the two end surfaces of the first power voltage line VSS1, and improving the water and oxygen blocking capability of the display panel.

Figure 9:
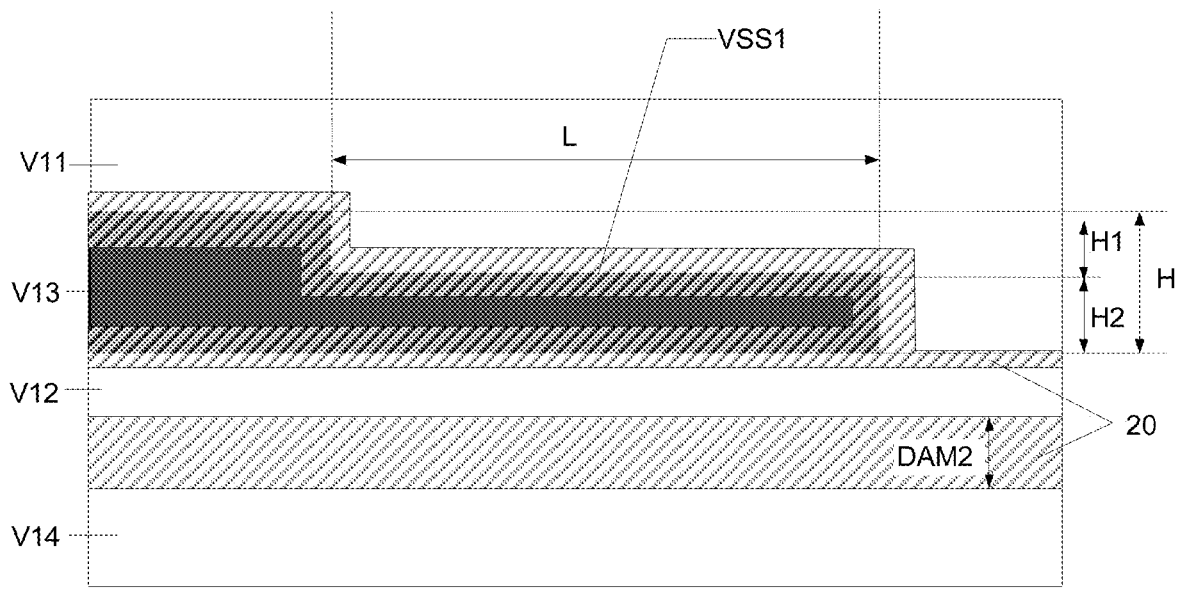
FIG. 9 is a partial structural top view of another display panel provided by an embodiment of the present disclosure.

Optionally, in the display panel provided by the embodiments of this disclosure, as shown in FIG. 9, the first power voltage line VSS1 has a stepped structure at the cut-off end along the extension direction of the first power voltage line, and a stepped surface of the stepped structure is on a side, facing the display region, of the first power voltage line VSS1; and a contour of the first groove V11 is same as a contour of a side, adjacent to the first groove, of the first power voltage line VSS1. Therefore, the path of water vapor intrusion at the end surfaces of the first power voltage line VSS1 is extended, and the risk of water vapor intrusion into the display region is reduced.

During specific implementation, the wider the stepped surface of the stepped structure, the longer the path of water vapor intrusion. Optionally, in the display panel provided by the embodiments of this disclosure, as shown in FIG. 9, the ratio of the total width L of the stepped structure in a first direction to the total height H of the stepped structure in a second direction is greater than or equal to 5 and less than or equal to 10. The first direction is the extension direction of the first power voltage line VSS1, and the second direction is perpendicular to the first direction.

Further, in the embodiments of this disclosure, the ratio of the total width L of the stepped structure in the first direction to the total height H of the stepped structure in the second direction is greater than 7 and less than 9, for example, in FIG. 9, H1=205.6 nm, H2=239.4 nm, L=3567 nm, and the ratio of the total width L of the stepped structure in the first direction to the total height H of the stepped structure in the second direction is equal to 3567/445, which is not limited here.

Figure 10:
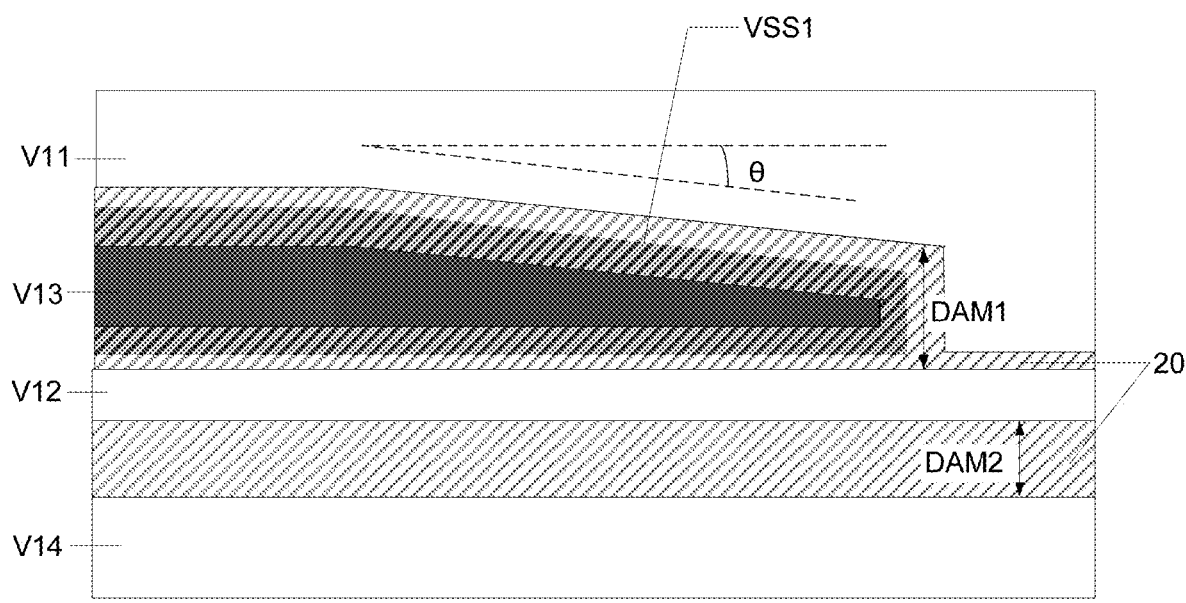
FIG. 10 is a partial structural top view of yet another display panel provided by an embodiment of the present disclosure.

Optionally, in the display panel provided by the embodiments of this disclosure, as shown in FIG. 10, the angle $\theta$ between a side, close to the cut-off end in the extension direction of the first power voltage line VSS1 and facing the display region, of the first power voltage line VSS1 and an adjacent border of the display region is more than 0 degree and less than 90 degrees; and a contour of the first groove V11 is same as a contour of a side, adjacent to the first groove, of the first power voltage line VSS1. Therefore, the path of water and oxygen intrusion at the end surfaces of the first power voltage line VSS1 is extended, and the risk of water and oxygen intrusion into the display region is reduced.

During specific implementation, in FIG. 10, the smaller the angle $\theta$, the longer the path of water vapor intrusion, but the more difficult the process. Therefore, considering the water vapor blocking effect and the difficulty of the process, the angle $\theta$ is set to range from 5 degrees to 30 degrees, for example, $\theta$=22 degrees, which is not limited here.

Optionally, in the display panel provided by the embodiments of this disclosure, as shown in FIGS. 4 to 10, the first planarization layer has a third groove V13; and an orthographic projection of the third groove V13 on the substrate is within the orthographic projection of the first power voltage line VSS1 on the substrate. The third groove V13 is provided to facilitate the subsequent electrical connection of the first power voltage line VSS1 with the cathode layer, and to increase the water and oxygen blocking capability of the region corresponding to the first power voltage line VSS1.

Optionally, in the display panel provided by the embodiments of this disclosure, as shown in FIGS. 4 to 10, a pattern of the third groove V13 is similar to a pattern of the first power voltage line VSS1. In this way, the area of the third groove V13 can be made as large as possible.

Optionally, in the display panel provided by the embodiments of this disclosure, as shown in FIGS. 4 to 10, the first planarization layer has a fourth groove V14. The fourth groove V14 is arranged around the second dam region DAM2, and the fourth groove V14 is used to prevent water and oxygen from entering the second dam region DAM2 from the outside.

Figure 11:
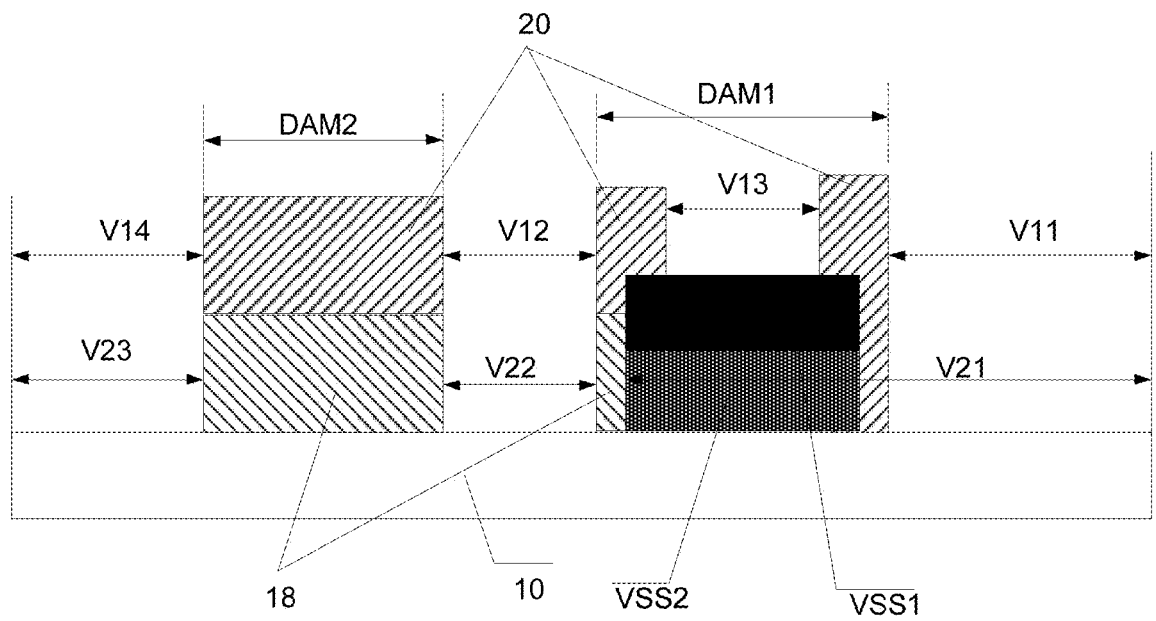
FIG. 11 is a cross-sectional structure diagram of yet another display panel provided by an embodiment of the present disclosure.

Optionally, in the display panel provided by the embodiments of this disclosure, as shown in FIG. 11, the border region further includes a second power voltage line VSS2 and a second planarization layer 18.

The second power voltage line VSS2 is electrically connected to the first power voltage line VSS1 and located between the substrate 10 and the first power voltage line VSS1.

The second planarization layer 18 is located between a film layer where the second power voltage line VSS2 is located and a film layer where the first power voltage line VSS1 is located.

An orthographic projection of the second planarization layer 18 on the substrate 10 is within the first dam region DAM1 and the second dam region DAM2.

The above-mentioned display panel is of a double-layer power voltage line structure, and the overall resistance of the power voltage lines can be reduced by two layers of power voltage lines.

In this disclosure, the orthographic projection of the second planarization layer 18 on the substrate 10 does not overlap with the orthographic projection of the second power voltage line VSS2 on the substrate 10, so that the first power voltage line VSS1 is in direct contact with the second power voltage line VSS2 to achieve electrical connection.

Optionally, in the display panel provided by the embodiments of this disclosure, as shown in FIG. 11, the second planarization layer 18 has a fifth groove V21, and the orthographic projections of the first groove V11 and the third groove V13 on the substrate 10 are located within an orthographic projection of the fifth groove V21 on the substrate 10. Thus, the formation of a water and oxygen path by the second planarization layer 18 at the regions corresponding to the first groove V11 and the third groove V13 is avoided.

Optionally, in the display panel provided by the embodiments of this disclosure, as shown in FIG. 11, the second planarization layer 18 further has a sixth groove V22 and a seventh groove V23, an orthographic projection of the sixth groove V22 on the substrate 10 overlaps with an orthographic projection of the second groove V12 on the substrate 10, and an orthographic projection of the seventh groove V23 on the substrate 10 overlaps with an orthographic projection of the fourth groove V14 on the substrate 10. The sixth groove V22 is used to form a water and oxygen barrier between the first dam region DAM1 and the second dam region DAM2. The seventh groove V23 is used to prevent water and oxygen from entering the second dam region DAM2 from the outside.

Optionally, in the display panel provided by the embodiments of this disclosure, the first power voltage line is arranged on a same layer as the power wiring layer in the display region, and the second power voltage line is arranged on the same layer as the source and drain electrode layer in the display region.

Optionally, in the display panel provided by the embodiments of this disclosure, the border region further includes an anode lapping layer and a pixel defining layer.

The anode lapping layer is on a side, facing away from the substrate, of the first planarization layer, and arranged on a same layer as the anode layer. The pixel defining layer is on a side, facing away from the substrate, of the anode lapping layer. An orthographic projection of the anode lapping layer on the substrate at least partially overlaps with the orthographic projection of the first power voltage line on the substrate; and the anode lapping layer is electrically connected to the first power voltage line through the third groove. According to the above-mentioned display panel provided by the embodiments of this disclosure, the first power voltage line is lapped with the cathode layer by means of the anode lapping layer, which can reduce the resistance and avoids the increase in process difficulty due to a deep via hole when the first power voltage line is directly electrically connected to the cathode layer.

Optionally, in the display panel provided by the embodiments of this disclosure, an orthographic projection of the pixel defining layer on the substrate at least covers a border of the anode lapping layer. In other words, the border of the anode lapping layer needs to be wrapped with a pixel defining layer made of an organic material. A backplane circuit is thus prevented from being damaged by static electricity through the anode lapping layer with high conductivity at the cutoff of the anode lapping layer.

Optionally, the display panel further includes a thin film encapsulation layer, and the thin film encapsulation layer is formed by a laminated structure of an organic layer and an inorganic layer, which is not limited herein.

During specific implementation, in the display panel provided by the embodiments of this disclosure, the substrate may be made of any suitable insulating material with flexibility. For example, the substrate may be made of a polymer material, such as polyimide (PI), polycarbonate (PC), polyethersulfone (PES), polyethylene terephthalate (PET), polyethylene naphthalate (PEN), polyarylate (PAR) or glass fiber reinforced plastic (FRP).

Based on the same inventive concept, embodiments of this disclosure further provides a display apparatus, including a driving chip and any one of the above-mentioned display panels provided by the embodiments of this disclosure. The display apparatus may be any flexible product or component with a display function, such as a mobile phone or a tablet computer. The implementation of the display apparatus may refer to the embodiments of the above-mentioned display panel, and details are not described herein again.

In the display panel and the display apparatus provided by the embodiments of this disclosure, the first planarization layer has the first groove and the second groove, and the first groove is between the first dam region and the display region, so that a water and oxygen barrier is formed between the first dam region and the display region; and the second groove is between the first dam region and the second dam region to avoid the formation of a water and oxygen path between the first dam region and the second dam region. The orthographic projection of the first power voltage line on the substrate is within the first dam region, so that the first planarization layer located within the first dam region can be used to cover the side surface of the first power voltage line to avoid the risk of further etching of the first power voltage line by the subsequent process. On the other hand, the first power voltage line is arranged in the first dam region, and the first planarization layer has the second groove between the first dam region and the second dam region, which can avoid the communication between the first planarization layer at a cut-off end of the first power voltage line and the first planarization layer in the second dam region, thereby improving the water and oxygen blocking capability of the display panel.

Obviously, those skilled in the art can make various modifications and variations to this disclosure without departing from the spirit and scope of this disclosure. Thus, if these modifications and variations of this disclosure fall within the scope of the claims of this disclosure and their equivalent technologies, this disclosure is also intended to include these modifications and variations.

What is claimed is:

1. A display panel, comprising: a substrate, wherein:
the substrate has a display region and a border region surrounding the display region;
the border region comprises a first power voltage line and a first planarization layer sequentially stacked on a side of the substrate;
the border region has a first dam region surrounding the display region and a second dam region surrounding the first dam region;
an orthographic projection of the first power voltage line on the substrate is entirely within the first dam region;
at least a part of an orthographic projection of the first planarization layer on the substrate is within the first dam region and the second dam region, and a part of the first planarization layer within the first dam region at least covers a side surface of the first power voltage line; and
the first planarization layer has a first groove and a second groove, the first groove is between the first dam region and the display region, and the second groove is between the first dam region and the second dam region;
wherein an orthographic projection, on a plane perpendicular to the substrate, of a side surface of the first groove away from the display region is covered by an orthographic projection, on the plane perpendicular to the substrate, of a side surface of the first power voltage line close to the display region and an orthographic projection, on the plane perpendicular to the substrate, of an end surface of the first power voltage line in an extension direction of the first power voltage line; the first power voltage line has a stepped structure, and a stepped surface of the stepped structure is on a side, close to the display region, of the first power voltage line; and a contour of the first groove is the same as a contour of a side, adjacent to the first groove, of the first power voltage line;
wherein an orthographic projection of the second groove on the substrate does not overlap with the orthographic projection of the first power voltage line on the substrate.

2. The display panel according to claim 1, wherein a ratio of a total width of the stepped structure in a first direction to a total height of the stepped structure in a second direction is greater than or equal to 5 and less than or equal to 10, wherein, the first direction is the extension direction of the first power voltage line, and the second direction is perpendicular to the first direction.

3. The display panel according to claim 1, wherein:
the first planarization layer has a third groove; and
an orthographic projection of the third groove on the substrate is covered by the orthographic projection of the first power voltage line on the substrate.

4. The display panel according to claim 3, wherein a pattern of the third groove is similar to a pattern of the first power voltage line.

5. The display panel according to claim 1, wherein the border region further comprises:
a second power voltage line electrically connected to the first power voltage line and located between the substrate and the first power voltage line; and
a second planarization layer located between the first planarization layer and the substrate;
wherein an orthographic projection of the second planarization layer on the substrate is within the first dam region and the second dam region, and the orthographic projection of the second planarization layer on the substrate does not overlap with an orthographic projection of a top surface of the second power voltage line on the substrate and the orthographic projection of a top surface of the first power voltage line on the substrate.

6. A display apparatus, comprising a driving chip and a display panel, wherein the display panel comprises a substrate; the substrate has a display region and a border region surrounding the display region;
the border region comprises a first power voltage line and a first planarization layer sequentially stacked on a side of the substrate;
the border region has a first dam region surrounding the display region and a second dam region surrounding the first dam region;
an orthographic projection of the first power voltage line on the substrate is entirely within the first dam region;
at least a part of an orthographic projection of the first planarization layer on the substrate is within the first dam region and the second dam region, and a part of the first planarization layer within the first dam region at least covers a side surface of the first power voltage line; and
the first planarization layer has a first groove and a second groove, the first groove is between the first dam region and the display region, and the second groove is between the first dam region and the second dam region;
wherein an orthographic projection, on a plane perpendicular to the substrate, of a side surface of the first groove away from the display region is covered by an orthographic projection, on the plane perpendicular to the substrate, of a side surface, close to the display region, of the first power voltage line close to the display region and an orthographic projection, on the plane perpendicular to the substrate, of an end surface of the first power voltage line in an extension direction of the first power voltage line; the first power voltage line has a stepped structure, and a stepped surface of the stepped structure is on a side, close to the display region, of the first power voltage line; and a contour of the first groove is the same as a contour of a side, adjacent to the first groove, of the first power voltage line;
wherein an orthographic projection of the second groove on the substrate does not overlap with the orthographic projection of the first power voltage line on the substrate.

7. The display apparatus according to claim 6, wherein:
a ratio of a total width of the stepped structure in a first direction to a total height of the stepped structure in a second direction is greater than or equal to 5, and less than or equal to 10,
wherein, the first direction is the extension direction of the first power voltage line, and
the second direction is perpendicular to the first direction.

8. The display apparatus according to claim 6, wherein:
the first planarization layer has a third groove; and
an orthographic projection of the third groove on the substrate is covered by the orthographic projection of the first power voltage line on the substrate.

9. The display apparatus according to claim 8, wherein a pattern of the third groove is similar to a pattern of the first power voltage line.

10. The display apparatus according to claim 6, wherein the border region further comprises:
- a second power voltage line electrically connected to the first power voltage line and located between the substrate and the first power voltage line; and
- a second planarization layer located between the first planarization layer and the substrate;
- wherein an orthographic projection of the second planarization layer on the substrate is within the first dam region and the second dam region, and the orthographic projection of the second planarization layer on the substrate does not overlap with an orthographic projection of a top surface of the second power voltage line on the substrate and the orthographic projection of a top surface of the first power voltage line on the substrate.

11. A display panel, comprising: a substrate, wherein:
- the substrate has a display region and a border region surrounding the display region;
- the border region comprises a first power voltage line and a first planarization layer sequentially stacked on a side of the substrate;
- the border region has a first dam region surrounding the display region and a second dam region surrounding the first dam region;
- an orthographic projection of the first power voltage line on the substrate is entirely within the first dam region, and the first power voltage line surrounds the display region and comprises an opening;
- at least a part of an orthographic projection of the first planarization layer on the substrate is within the first dam region and the second dam region, and a part of the first planarization layer within the first dam region at least covers a side surface of the first power voltage line; and
- the first planarization layer has a first groove and a second groove, the first groove is between the first dam region and the display region, and the second groove is between the first dam region and the second dam region;
- wherein an orthographic projection, on a plane perpendicular to the substrate, of a side surface of the first groove away from the display region is covered by an orthographic projection, on the plane perpendicular to the substrate, of a side surface of the first power voltage line close to the display region and an orthographic projection, on the plane perpendicular to the substrate, of an end surface of the first power voltage line adjacent to the opening of the first power voltage line, wherein the end surface of the first power voltage line is perpendicular to a side of the display region close to the opening, and the end surface of the first power voltage line is located at a side of the second groove close to the display region;
- wherein the first power voltage line has a stepped structure, and a stepped surface of the stepped structure is on a side, close to the display region, of the first power voltage line; and a contour of the first groove is the same as a contour of a side, adjacent to the first groove, of the first power voltage line;
- wherein an orthographic projection of the second groove on the substrate does not overlap with the orthographic projection of the first power voltage line on the substrate.

* * * * *